United States Patent
Han et al.

(10) Patent No.: US 12,108,618 B2
(45) Date of Patent: Oct. 1, 2024

(54) WHITE LIGHT EMITTING DEVICE WITH LIGHT EMITTING LAYERS IN A SINGLE CONTOUR REGION AND DISPLAY DEVICE USING THE SAME

(71) Applicant: LG DISPLAY CO., LTD., Seoul (KR)

(72) Inventors: Mi Young Han, Paju-si (KR); Min Hyeong Hwang, Paju-si (KR); Jung Keun Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 420 days.

(21) Appl. No.: 17/560,586

(22) Filed: Dec. 23, 2021

(65) Prior Publication Data

US 2022/0209158 A1    Jun. 30, 2022

(30) Foreign Application Priority Data

Dec. 24, 2020   (KR) .......................... 10-2020-0183936

(51) Int. Cl.
*H10K 50/13*    (2023.01)
*H10K 59/12*    (2023.01)
*H10K 59/38*    (2023.01)
*H10K 102/00*   (2023.01)

(52) U.S. Cl.
CPC ........... *H10K 50/131* (2023.02); *H10K 59/12* (2023.02); *H10K 59/38* (2023.02); *H10K 2102/3035* (2023.02); *H10K 2102/351* (2023.02)

(58) Field of Classification Search
CPC ........... H10K 50/131; H10K 2102/351; H10K 50/19; H10K 59/32
See application file for complete search history.

(56) References Cited

U.S. PATENT DOCUMENTS

| | | | |
|---|---|---|---|
| 2005/0206305 A1* | 9/2005 | Masuda | H10K 50/125 |
| | | | 313/504 |
| 2008/0268282 A1 | 10/2008 | Spindler et al. | |
| 2018/0208836 A1* | 7/2018 | Kuma | H10K 50/131 |
| 2019/0181369 A1* | 6/2019 | You | H10K 50/13 |

FOREIGN PATENT DOCUMENTS

| | | |
|---|---|---|
| EP | 3035402 A1 | 6/2016 |
| KR | 2015-0124010 A | 11/2015 |
| KR | 2020-0001045 A | 1/2020 |
| TW | 201926759 A | 7/2019 |

OTHER PUBLICATIONS

Extended European Search Report dated May 3, 2022 issued in Patent Application No. 21217357.9 (8 pages).
Taiwanese Office Action dated Nov. 7, 2022 issued in Patent Application No. 1101474291 (12 pages).
Choi et al. "Optimization of 2Stack WOLED Structure With Consideration on Color Gamut and Power Consumption", Journal of Display Technology, vol. 5, No. 12, Dec. 2009.

* cited by examiner

*Primary Examiner* — Nduka E Ojeh
(74) *Attorney, Agent, or Firm* — POLSINELLI PC

(57) ABSTRACT

A white light emitting device and a display device using the same which can prevent a change in luminance due to change in viewing angle, improve color deviation, and lower a driving voltage at the same time, through a change in an internal stack structure and a thickness an emission-side electrode with regard to a vertical distance from a lower surface of the first electrode to a lower surface of the second electrode.

18 Claims, 12 Drawing Sheets

WHITE LIGHT EMITTING DEVICE WITH LIGHT EMITTING LAYERS IN A SINGLE CONTOUR REGION AND DISPLAY DEVICE USING THE SAME

CROSS-REFERENCE TO RELATED APPLICATION

This application claims the benefit of Korean Patent Application No. 10-2020-0183936, filed on Dec. 24, 2020, which is hereby incorporated by reference in its entirety.

BACKGROUND

Field of the Disclosure

The present disclosure relates to a light emitting device, and more particularly, to a white light emitting device and a display device using the same which is capable of improving efficiency, prevents changes in a luminance and a color according to a viewing angle and lowers a driving voltage by changing a structure.

Description of the Background

Recently, in order to omit a separate light source and to achieve device compactness and clear color display, a self-luminous display device is considered as a competitive application. The self-luminous display device may be classified into an organic light emitting display device and an inorganic light emitting display device by an internal emitting material.

In the self-luminous display device, a plurality of sub-pixels are provided and a light emitting device is provided in each sub-pixel without a separate light source.

A display device is required to have a high resolution and a high integration. A tandem-type white light emitting device (hereinafter, referred to as a "white light emitting device") is proposed and studied since an organic layer and/or a light emitting layer in the tandem device are commonly formed on a substrate without a fine metal mask (FMM).

A tandem-type display device includes a plurality of light emitting layers overlapping with each other. Each light emitting layer has different resonance characteristics, thus a color defect may be observed when a user views the tandem-type display device at a certain viewing angle.

SUMMARY

Accordingly, the present disclosure is directed to a white light emitting device and a display device using the same that substantially obviate one or more problems due to limitations and disadvantages described above.

More specifically, the present disclosure is to provide a white light emitting device and a display device using the same which can prevent a change in luminance due to a change in viewing angle, prevent or reduce a color deviation, and simultaneously lower driving voltage by changing an internal stack structure and a relationship with an emission side electrode.

A white light emitting device according to one aspect of the present disclosure may comprise a first stack on a first electrode, the first stack including a red light emitting layer and a green light emitting layer, a charge generation layer on the first stack, a second stack on the charge generation layer, the second stack including a blue light emitting layer and a second electrode on the second stack, wherein a light is emitted through the first electrode, and wherein a thickness of the first electrode is 0.1 times or more and 0.26 times or less of a distance from a lower surface of the first electrode to a lower surface of the second electrode.

Also, a display device according to one aspect of the present disclosure may comprise a substrate including a plurality of sub-pixels, a thin-film transistor at each of the sub-pixels, a first electrode connected to the thin-film transistor, at each of the sub-pixels, a white organic stack on the first electrode, the white organic stack comprising a first stack including a red light emitting layer and a green light emitting layer, a second stack including a blue light emitting layer and a charge generation layer between the first and second stacks, and a second electrode on the white organic stack. A light may be emitted through the first electrode from the white organic stack. A thickness of the first electrode may be 0.1 times or more and 0.26 times or less of a total thickness of the first electrode and the white organic stack.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate aspect(s) of the disclosure and together with the description serve to explain the principle of the disclosure.

In the drawings.

DETAILED DESCRIPTION

Figure 1:
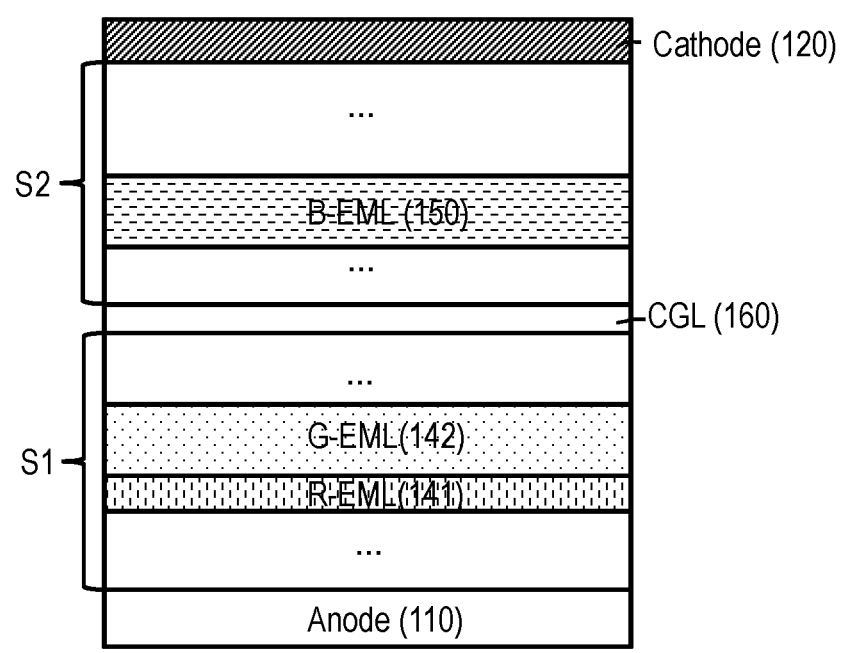
FIG. 1 is a cross-sectional view schematically illustrating a white light emitting device in accordance with the present disclosure.

Reference will now be made in detail to the aspects of the present disclosure, examples of which are illustrated in the accompanying drawings. However, the present disclosure may be embodied in many alternative forms and should not be construed as limited to the aspects set forth herein, and the aspects of the present disclosure are provided only to completely disclose the disclosure and to completely inform those skilled in the art of the scope of the disclosure. Therefore, it should be understood that there is no intent to limit the disclosure to the particular forms disclosed, but on the contrary, the disclosure is to cover all modifications, equivalents, and alternatives within the spirit and scope of the disclosure as defined by the claims.

Shapes, sizes, rates, angles, numbers, etc. disclosed in the drawings to describe the aspects of the present disclosure are only exemplary and do not limit the present disclosure. In the following description of the aspects and the drawings, the same or similar elements are denoted by the same reference numerals even though they are depicted in different drawings. In the following description of the aspects of the present disclosure, a detailed description of known functions and configurations incorporated herein will be omitted when it may make the subject matter of the present disclosure rather unclear. In the following description of the aspects, the terms "including" and "having" will be interpreted as indicating presence of one or more other characteristics, numbers, steps, operations, elements or parts stated in the specification or combinations thereof, and do not exclude presence of characteristics, numbers, steps, operations, elements, parts or combinations thereof, or possibility of adding the same. It will be understood that a singular expression includes a plural expression unless otherwise stated.

In interpretation of elements included in the various aspects of the present disclosure, it will be interpreted that the elements include error ranges unless otherwise stated.

In the following description of the aspects, it will be understood that, when positional relations are expressed, for example, when an element is 'on', 'above', 'under', 'beside', etc. another element, the two elements may directly contact each other, or one or more other elements may be interposed between the two elements unless the term 'immediately' or 'directly' is used.

In the following description of the aspects, it will be understood that, when temporal relations are expressed, for example, the term expressing a sequence of events, such as 'after', 'subsequent to', 'next to' or before' may encompass continuous relationship between the events, or discontinuous relationship between the events unless the term 'immediately' or 'directly' is used.

In the following description of the aspects, it will be understood that, when the terms "first", "second", etc. are used to describe various elements, these terms are used merely to distinguish the same or similar elements. Therefore, a first element described hereinafter could be termed a second element without departing from the technical scope of the disclosure.

Characteristics of the various aspects of the present disclosure may be partially or wholly connected to or combined with each other and technically variously driven and interlocked with each other, and the various aspects may be independently implemented or be implemented together in connection with each other.

In the following description of the aspects, an electroluminescence (EL) spectrum is calculated by multiplying (1) a photoluminescence (PL) spectrum, in which unique characteristics of a luminescent material, such as a dopant material or a host material included in an organic light emitting layer, are reflected, by (2) an out-coupling emittance spectrum curve, determined according to the structure and optical characteristics of an organic light emitting device including thicknesses of organic layers, such as an electron transport layer, etc.

Figure 2:
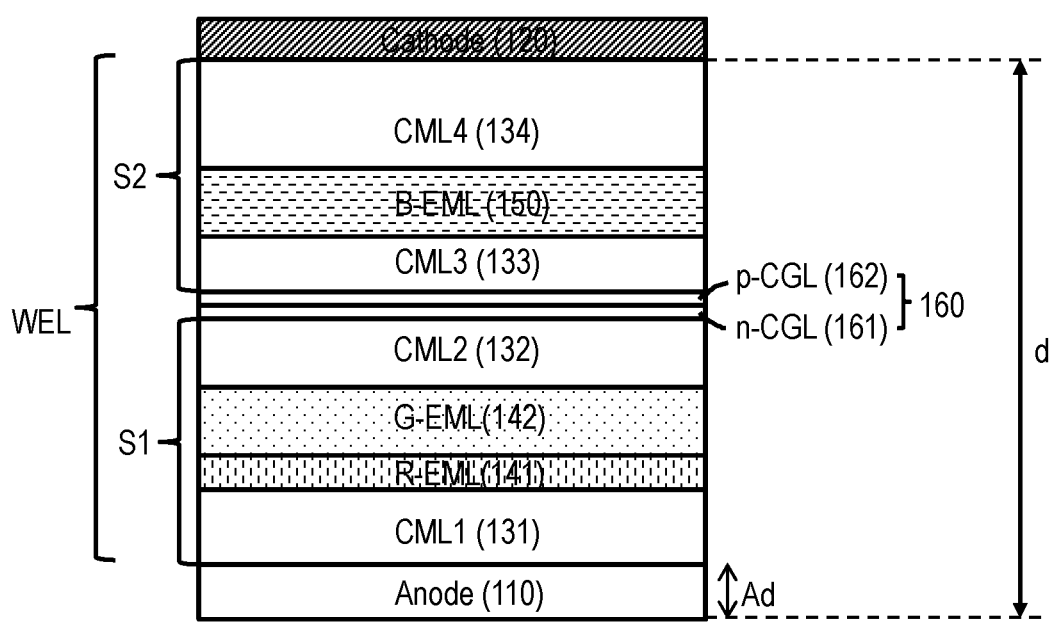
FIG. 2 is a cross-section view in accordance with one aspect of FIG. 1.
Figure 3:
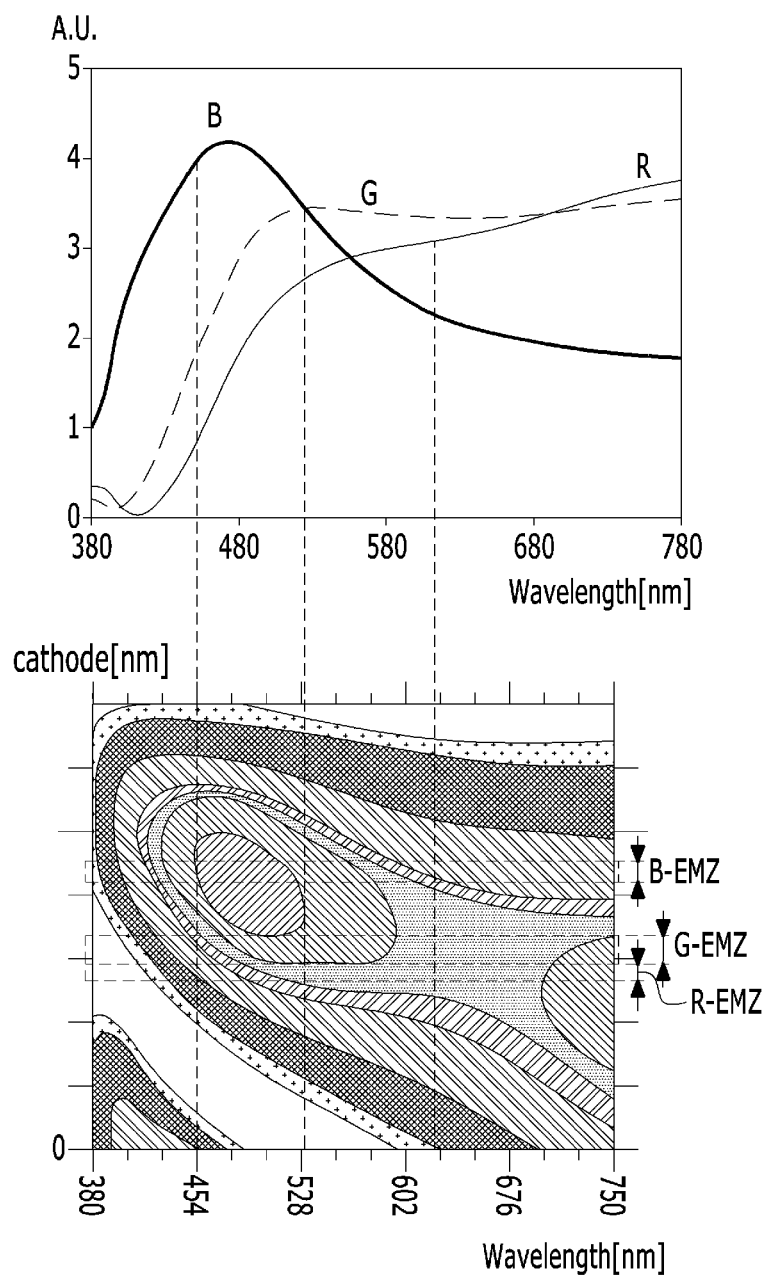
FIG. 3 is a contour map representing an EL spectrum of each emission color and corresponding positions of light emitting layers in the white light emitting device of the present disclosure.

FIG. 1 is a cross-sectional view schematically illustrating a white light emitting device in accordance with the present disclosure, and FIG. 2 is a cross-section view in accordance with one aspect of FIG. 1. Also, FIG. 3 is a contour map representing an EL spectrum of each emission color and corresponding positions of light emitting layers in the white light emitting device of the present disclosure.

As shown in FIGS. 1 and 2, a white light emitting device 2000 according to the present disclosure comprises a first stack S1 on a first electrode 110, a charge generation layer 160 on the first stack S1, a second stack S2 on the charge generation layer 160, and a second electrode 120 on the second stack S2. The first stack S1 includes a red light emitting layer 141 and a green light emitting layer 142, and the second stack S2 includes a blue light emitting layer 150. It is to be noted that, although the green light emitting layer 142 is disposed on the red light emitting layer 141 as shown in FIG. 2, but aspects of the present disclosure are not limited thereto. For example, the red light emitting layer 141 may also be disposed on the green light emitting layer 142.

In the white light emitting device 2000 of the present disclosure, each of light emitting layers 141, 142 and 150 is located at a specific position. Also, in the white light emitting device 2000, a thickness of the first electrode 110 is applied under a specific condition with regard to a distance d from a lower surface of the first electrode 110 to the second electrode 120. Through this, in a contour map of a white organic stack WEL defining each light emission position, the red light emitting layer 141, the green light emitting layer 142 and the blue light emitting layer 150 are applied to contour regions having each gentle single slope with respect to the distance d from a lower surface of the first electrode 110 to the second electrode 120. Thus, each position of the red light emitting layer 141, the green light emitting layer 142 and the blue light emitting layer 150 is configured to prevent interference of other color emission and to maintain stable luminance and color characteristic against changes in a viewing angle.

In the white light emitting device 2000 of the present disclosure, the first electrode 110 is an emission side, and a light from an inside of the white light emitting device 2000 is emitted through the first electrode 110. The first electrode 110 is a transparent electrode and the second electrode 120 is a reflective electrode. Light generated from the red light emitting layer 141 and the green light emitting layer 142 of the first stack S1 and light generated from the blue light emitting layer 150 of the second stack S2 are resonated between the first and second electrodes 110 and 120, and finally emitted through the first electrode 110. The first electrode 110 may be a transparent oxide electrode including at least two elements selected from among indium In, tin Sn, zinc Zn, Titanium Ti and gallium Ga. For example, the first electrode 110 may be formed of a material such as ITO and IZO. The cathode 120 may be formed of Al, Al alloy, Ag, Ag Alloy, Mg, Mg alloy or APC (Ag—Pd—Cu) and the like, including a reflective electrode.

Functionally, the first electrode 110 may be referred to as an anode and the second electrode 120 may be referred to as a cathode.

The white light emitting device 2000 of the present disclosure is configured to reduce color viewing angle characteristics that change depending on a viewing angle. For example, in the white light emitting device 2000, light emitting layers of the first stack and the second stack are positioned at contour regions each having gentle profile, so each light emitting layer is positioned where interference of light emission of other color does not appear, as shown in FIG. 3. Thus, color variability can be reduced or prevented according to the viewing angle. For example, a contour region in which a red or green light emitting layer is positioned and a contour region in which a blue light emitting layer is positioned are arranged to have different inclinations, as a viewing angle increases, a difference becomes large between an angle corresponding to an optimal light emission region of the red or green light emitting layer and an angle corresponding to an optimal light emission region of the blue light emitting layer. Therefore, it causes a difference in visibility between the red or green luminance change and the blue luminance change. The white light emitting device 2000 of the present disclosure is to reduce or prevent the different in visibility between red or green luminance change and the blue luminance change, each of the red, green and blue light emitting layers is disposed in the contour region having a single gentle slope.

Also, in the white light emitting device 2000 of the present disclosure, a thickness Ad of the first electrode 110 may be 0.1 times or more and 0.26 times or less of a distance 'd' from a lower surface of the first electrode 110 to a lower surface of the second electrode 120.

Herein, the distance 'd' from the lower surface of the first electrode 110 to the lower surface of the second electrode 120 may be 150 nm to 200 nm. The distance "d" includes a thickness of the first electrode 110 and a thickness of white organic stack WEL which comprises organic materials. In particular, in the distance d from the lower surface of the first electrode 110 to the lower surface of the second electrode 120, there are the first electrode 110 and the white organic stack WEL including two stacks, but the distance d is 200 nm or less. Thus, the white light emitting device 2000 of the present disclosure is substantially thin, even though the white light emitting device 2000 has the two stacks, so a distance is very short between the red light emitting layer 141 which is lowermost located among light emitting layers of the white organic stack WEL and the blue light emitting layer 150 which is uppermost located among light emitting layers of the white organic stack WEL. For example, the red light emitting layer 141 and the green light emitting layer 142 may be in contact with each other, and each thickness of layers 132, 160 and 133 between the green light emitting layer 142 and the blue light emitting layer 150 may be thin. Also, since the thickness Ad of the first electrode 110 is proportional to the distance d from the lower surface of the first electrode 110 to the lower surface of the second electrode 120, the thickness Ad of the first electrode 110 is smaller than that of a white organic light emitting device having known two-stack structure.

Between the first stack S1 and the second stack S2, there is a charge generation layer CGL (160) including a n-type charge generation layer n-CGL (161) and a p-type charge generation layer p-CGL (162). The n-type charge generation layer n-CGL (161) generates electron and provides the electrons into the first stack S1 which is away from the second electrode 120. The p-type charge generation layer p-CGL (162) generates holes and provides the holes into the second stack S2 which is away from the first electrode 110. The charge generation layer 160 can be formed of two layers as shown in FIG. 2, and also can be formed of one layer including different dopants as shown in FIG. 1. In the white light emitting device 2000 of the present disclosure, the charge generation layer 160 is provided to supply holes and electrons into adjacent stacks and to remain a charge balance in each light emitting layer of each stack S1 and S2.

The first stack S1 may comprise a first common layer 131 between the red light emitting layer 141 and the first electrode 110, and a second common layer 132 between the green light emitting layer 142 and the charge generation layer 160. The first common layer 131 may comprise a hole injection layer and a hole transport layer. In some cases, the first common layer 131 further comprises an electron blocking layer adjacent to the red light emitting layer 141. The second common layer 132 may comprise an electron transport layer.

Also, the second stack 2 may comprise a third common layer 133 between the charge generation layer 160 and the blue light emitting layer 150 and a fourth common layer 134 between the blue light emitting layer 150 and the second electrode 120. The third common layer 133 may comprise a hole transport layer, and the fourth common layer 134 may comprise an electron transport layer and an electron injection layer.

In each stack, the first and third common layers 131, and 133 which are positioned under the light emitting layers relates to a transport of holes, and the second and fourth common layers 132 and 134 which are positioned above the light emitting layers relates to a transport of electrons.

The positions (vertical distance) of the red light emitting layer 141, the green light emitting layer 142 and the blue light emitting layer 150 from the second electrode 120 may be adjusted by controlling thicknesses of the common layers 131, 132, 133 and 134 of stacks.

A host material used in the red light emitting layer 141 may include an aryl group as a core, and may include one of an aryl group, a substituted or unsubstituted aryl group having a carbon number of 6 to 24, a substituted or unsubstituted fused aryl group having a carbon number of 10 to 30, a substituted or unsubstituted hetero aryl group having a carbon number of 2 to 24, a substituted or unsubstituted alkyl group having a carbon number of 1 to 24, a substituted or unsubstituted hetero alkyl group having a carbon number of 1 to 24, a substituted or unsubstituted cyclo alkyl group having a carbon number of 3 to 24, a substituted or unsubstituted alkoxy group having a carbon number of 1 to 24, a substituted or unsubstituted aryl oxy group having a carbon number of 6 to 24, a substituted or unsubstituted alkyl silyl group having a carbon number of 1 to 24, a substituted or unsubstituted aryl silyl group having a carbon number of 6 to 24, a cyano group, a halogen group, deuterium and hydrogen, and R—R14 may form a fused ring with a neighboring substituted group.

In addition, the aryl group, which is a core component, may include one of phenyl, naphthalene, fluorene, carbazole, phenazine, phenanthroline, phenanthridine, acridine, cinnoline, quinazoline, quinoxaline, naphthyridine, phthalazine, quinolizine, indole, indazole, pyridazine, pyrazine, pyrimidine, pyridine, pyrazole, imidazole, and pyrrole.

In one example, a host material of the red light emitting layer 141 may include one or multiple ones of CBP, CDBP, mCP, BCP, BAlq, and TAZ.

In addition, the red light emitting layer 141 includes a dopant to emit red light, and a phosphorescent dopant may be, for example, Ir(piz)3(Tris)(1-phenylisoquinoline)iridium (III), Ir(piq)2(acac)(Bis)(1-phenylisoquinoline)(acetylacetonate)iridium(III), Ir(bip)2(acac)(Bis)2-benzolbithiophen-2-yl-pyridime(acetylacetonate)iridium(III), or Ir(BT)2(acac)(Bis)(2-pheylbenzothazolato)(acetylacetonate)iridium(III), without being limited thereto.

A host material of the green light emitting layer 142 may include C-545T(10-(2-benzothia-zylyl)-1,1,7,7-tetramethyl-2,3,6,7-tetrahydro-1H,5H), 11H-[1]benzo-pyrano[6,7,8-ij]quinolizin-11-ne, which use Alq3 as a matrix, derivatives thereof, quinacridone derivatives, and carbazole derivatives such as, for example, CBP, mCP, TCTA and TCP. Although Alq3 may emit green light by itself when it is used as a host, a green dopant is included in order to increase the luminous efficacy of green light, and may be one of a phosphorescent dopant and a fluorescent dopant. For example, the green dopant may be Ir(mppy)3, Ir(ppy)3, or Ir(ppy)2(acac).

Here, the blue light emitting layer 150 may include at least one blue host and at least one blue dopant. Specifically, the blue light emitting layer 150 may be formed by doping a pyrene derivative blue dopant or a boron derivative blue dopant in at least one host which is selected from at least one of an anthracene derivative, a pyrene derivative, and a perylene derivative.

Each wavelength of the red light emitting layer 141, the green light emitting layer 142 and the blue light emitting layer 150 may be adjusted by changing a substituent of its dopant.

The white light emitting device 2000 of the present disclosure implements a 2-stack 3-peak structure capable of emitting colors in which red, green and blue can be distinguished in two stacks.

Several methods are possible to represent a white emission. For example, a white emission may be implemented by including a plurality of light emitting dopants of different colors in one light emitting layer, or a white emission may be implemented by separately disposing blue, green and red light emitting layers in three or more stacks.

However, in a case including a plurality of light emitting dopants in one light emitting layer, excitation energies required for light emitting dopants are different, and a difference of quenching characteristics, a difference of efficiencies and a difference of lifetimes among light emitting dopants occur, during the continuous recombination of holes and electrodes. Accordingly, there is a problem that uniform white emission is impossible.

In a case that light emitting layers is divided into three or more stacks, there is a difference visibility in green, red and blue emission. Thus, there is a problem in that the color of a specific color is deteriorated when implemented as an actual display device. Also, as the number of stacks increases, process reproducibility decreases and a driving voltage increases.

As another example, a color viewing angle characteristics may be excellent by applying a yellow-green dopant to a structure of the 2-stack 2-peak. However, when a single yellow-green dopant is used, it is difficult to represent pure colors of red and green, respectively. In order to increase color purity, the structure realizing 2 stacks and 3 peaks is applied. Also, in this case, phosphorescent light emitting layers are provided in multi layers and it causes a color change which appears according to a viewing angle.

Accordingly, the white light emitting device of the present disclosure has a 2-stack 3-peak structure, so solves the problems that the process reproducibility in three or more stack structure is deteriorated and a driving voltage is increased due to an increased thickness of the organic stack. Also, the blue light emitting layer, the green light emitting layer and the red light emitting layer are separately provided in the white light emitting device, so reproducibility of each color can also be improved.

Moreover, in the white light emitting device of the present disclosure, as shown in the contour map of FIG. 3, in the vertical distance between the second electrode 120 and the first electrode 110, the total thickness (d-Ad) of organic materials which is determined by summing the first stack S1, the charge generation layer and the second stack S2 is thin, so the position of each light emitting layer is set in one contour region having a certain inclination. This is one feature that the white light emitting device of the present disclosure is differentiated from a first experimental example Ex1 of 2-stack 3-peak structure in which the positions of the light emitting layers are determined in contour regions having a plurality of inclinations. In the present disclosure, the thickness Ad of the first electrode 110 may be set to become 0.10 times or more to 0.26 times or less of the distance d from the lower surface of the first electrode 110 to the lower surface of the second electrode 120 and the distance d from the lower surface of the first electrode 110 to the lower surface of the second electrode 120 may be set to 150 nm to 200 nm, so the inclination of the contour region is gentle in the thin structure having two stacks. In particular, by determining the position of the blue light emitting layer, the position of the green light emitting layer and the position of the red light emitting layer, respectively, in the contour region having one gentle inclination, a multicolor interference is prevented compared to a structure that uses multiple contour regions to correspond to different light emitting layers. Also, when the position of the blue light emitting layer is determined in one gentle contour region, it is configured that a similar blue light intensity is generated at a certain vertical distance including the light emission region in which the blue light emitting layer is located, a similar green light intensity is generated at a certain vertical distance including the light emission region in which the green light emitting layer is located and a similar red light intensity is generated at a certain vertical distance including the light emission region in which the red light emitting layer is located. Through this, even when the white light emitting device is observed while tilting the white light emitting device from a front at a predetermined angle, each light emitting layer exhibits a similar emission color intensity, thereby preventing a change in luminance due to a change in the viewing angle and preventing color deviation at the same time. Such effects of preventing luminance change and color deviation due to the change in viewing angle is a very meaningful effect that can be obtained without increasing the process in the structure including disposing the red light emitting layer 141 and the green light emitting layer 142 adjacently.

As can be shown in FIG. 3, the position of each light emitting layer 141, 142 and 150 is determined in a region in which the light emission intensity of each light emitting color is equal or similar, and interference of other color light emission is prevented in the thickness range of each light emitting layer. For example, since the inclination of the contour region that determines the position of the light emitting layer is gentle at a distance from the second electrode, and the contour lines representing the optimal light emission of blue, green and red do not overlap or partially overlap other contour lines, the blue light emitting layer 150 is secured at a thickness of about 20 nm or more within a gentle contour line, and the green light emitting layer 142 and the red light emitting layer 141 are secured to be sequentially spaced downward from the blue light emitting 150. In order to have sufficient light emission area in each of the light emitting layers 142, 141 and 150, the green light emitting layer 142 is set to have a thickness of about 20 nm or more, and the red light emitting layer 141 is set to have a thickness of about 10 nm or more. The thicknesses of the blue, green and red light emitting layers 150, 142 and 141 may all be 30 nm or less so that the thickness between the first electrode 110 and the second electrode 120 is 150 nm or less. In addition, a distance from an upper surface of the green light emitting layer 142 to a lower surface of the blue light emitting layer 150 may be 30 nm to 65 nm, and a distance from a lower surface of the red light emitting layer 141 to an upper surface of the blue light emitting layer 150 may be 80 nm to 115 nm.

The blue light emitting layer may have an electroluminescence peak at a wavelength of 454 nm to 458 nm, the green light emitting layer may have an electroluminescence peak at a wavelength of 525 nm to 540 nm, and the red light emitting layer may have an electroluminescence peak at a wavelength of 560 nm to 626 nm.

Each of the light emitting layers 141, 142 and 150 is at a position where maximum constructive interference occurs, respectively, and satisfies Equation 1 below.

$$2\pi 2hz/\lambda - \pi = 2m\pi \quad \text{[Equation 1]}$$

('h' is a thickness of a white organic stack, and 'z' is a distance from a second electrode to a light emitting layer)

In the white light emitting device of the present disclosure, the total optical thickness including the distance d from the lower surface of the first electrode 110 to the second electrode 120 is set, and the position of each light emitting layer is determined in the provided white organic stack WEL, in consideration of the wavelengths of the dopants applied to the light emitting layers 141, 142 and 150. Each of the light emitting layers 141, 142 and 150 includes a dopant to control its emission wavelength with at least one host.

Each of the red light emitting layer 141 and the green light emitting layer 142 may include at least one host and a dopant for phosphorescence and the blue light emitting layer 150 may include of at least one host and a dopant for fluorescence.

The red light emitting layer 141 and the green light emitting layer 142 in the first stack S1 are adjacent to each other. As shown in FIG. 3, the red light emitting layer 141 and the green light emitting layer 142 are positioned so that each emission region of red and green is generated in the contour region where each color change is not large according to change of viewing angle. Therefore, the white emitting device of the present disclosure makes to represent each of the red, green and blue colors in an equal or similar color even if the viewing angle changes, so prevents luminance deviation and color deviation due to the viewing angle variation.

In some cases, the first stack S1 can comprise one single phosphorescence light emitting layer so to represent 2 peaks of green and red. In this case, in the phosphorescence light emitting layer, one or a plurality of phosphorescence dopants can have an EL peak at a wavelength range of 520 nm to 626 nm. Even in this case of having the single phosphorescence light emitting layer in the first stack S1, in the contour map of FIG. 3, the phosphorescent light emitting layer is positioned in a region where the contour region having the same or similar intensity with respect to the wavelength of the light emitting color of the phosphorescent light emitting layer is secured with a certain distance from the second electrode 120 at a vertical distance. Thus, it is possible to prevent occurrence of luminance deviation and color deviation due to the viewing angle variation.

In the white light emitting device of present disclosure, the blue light emitting layer 150 is positioned in the second stack S2, and the red and green phosphorescent light emitting layers 141 and 142 is positioned at the first stack S1. The blue light emitting layer 150 is positioned higher than the red and green light emitting layers 141 and 142. This is to position the blue light emitting layer 150 having relatively low visibility in the region having the greatest light emission intensity, than other phosphorescent light emitting layers 141 and 142, while disposing the blue, red and green light emitting layers 150, 141 and 142 at regions having the same inclination of the contour map. Through this, a viewer can recognize blue, green and red with comparable luminance without further providing an additional blue light emitting layer in the white light emitting device.

The charge generation layer 160 is provided between the first stack S1 and the second stack S2. For an example, the charge generation layer 160 comprises the n-type charge generation layer 161 and the p-type charge generation layer 162 stacked.

Hereinafter, a display device using the white light emitting device and a thin-film transistor array connected to the white light emitting device of the present disclosure may be provided.

Figure 4:
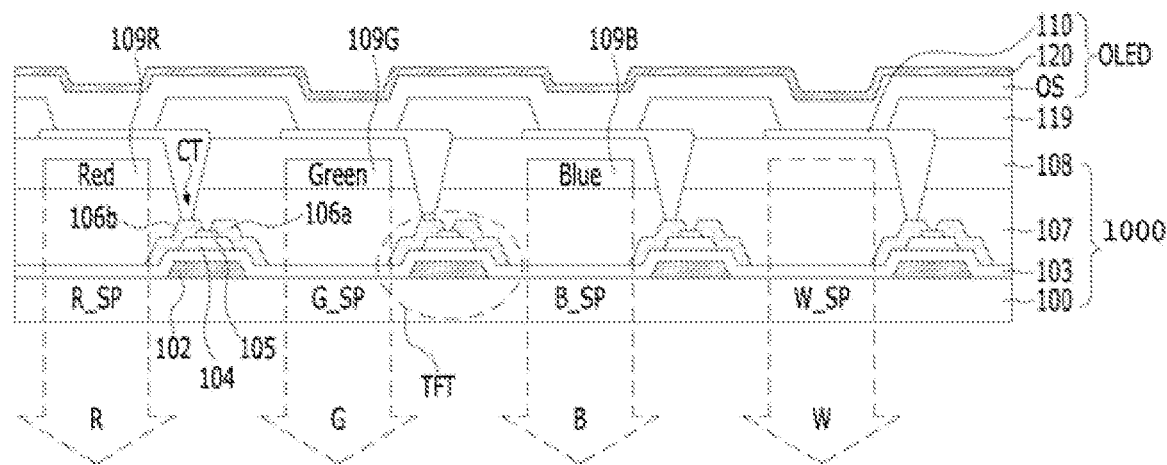
FIG. 4 is a cross-sectional view illustrating a display device including a white light emitting device of FIG. 2.

FIG. 4 is a cross-sectional view illustrating a display device including a white light emitting device of FIG. 2.

As shown in FIG. 4, the display device of the present disclosure may include a substrate 100, which has a plurality of subpixels R_SP, G_SP, B_SP and W_SP, a white light emitting device OLED (refer to FIGS. 1 to 3), which is commonly provided in the subpixels R_SP, G_SP, B_SP and W_SP of the substrate 100, a thin-film transistor TFT, which is provided in each of the subpixels and is connected to the first electrode 110 of the white light emitting device OLED, and color filter layers 109R, 109G and 109B, which are provided under the first electrode 110 of at least one of the subpixels.

Although the display device is illustrated as including the white subpixel W_SP, the aspect is not limited thereto. The white subpixel W_SP may be omitted, and only the red, green and blue subpixels R_SP, G_SP and B_SP may be included. In some cases, the red, green and blue subpixels may be replaced by a cyan subpixel, a magenta subpixel, and a yellow subpixel, which are capable of expressing white in combination.

The thin-film transistor TFT includes, for example, a gate electrode 102, a semiconductor layer 104, a source electrode 106a, which is connected to one side of the semiconductor layer 104, and a drain electrode 106b, which is connected to the opposite side of the semiconductor layer 104. Also, a channel protection layer 105 may be further provided so as to be in direct contact with the upper surface of the semiconductor layer 104 in order to prevent damage to a channel portion of the semiconductor layer 104.

A gate insulation film 103 is provided between the gate electrode 102 and the semiconductor layer 104.

The semiconductor layer 104 may be formed of a material selected from the group consisting of amorphous silicon, polycrystalline silicon, an oxide semiconductor, and combinations thereof. For example, if the semiconductor layer 104 is formed of an oxide semiconductor, heating temperature required to form the thin film transistor can be lowered, degree of freedom in using the substrate 100 is high, so that it will be advantageously applied to a flexible display device.

In addition, the drain electrode 106b of the thin-film transistor TFT may be connected to the first electrode 110 in the region of a contact hole CT, which is formed in first and second protective films 107 and 108.

The first protective film 107 is provided to primarily protect the thin-film transistor TFT. The color filter layers 109R, 109G and 109B may be provided on the first protective film 107.

When the plurality of subpixels SP includes a red subpixel R_SP, a green subpixel G_SP, a blue subpixel B_SP, and a white subpixel W_SP, each of the first to third color filter layers 109R, 109G and 109B is provided in a corresponding one of the subpixels other than the white subpixel W_SP so as to transmit white light, having passed through the first electrode 110, for each wavelength. The second protective film 108 is formed under the first electrode 110 so as to overlay the first to third color filter layers 109R, 109G and 109B. The first electrode 110 is formed on the surface of the second protective film 108 except for a portion thereof formed in the contact hole CT.

Here, the white light emitting device OLED includes a white organic stack OS between the first electrode 110, which is transparent, and the second electrode 120, which is disposed opposite the first electrode 110 and is reflective, and emits light through the first electrode 110. The white organic stack OS corresponds to the white organic stack WEL includes the first stack S1 of phosphorescence, the second stack S2 of blue light emitting, and the charge generation layer 160 between the first and second stacks S1 and S2, which is explained in FIG. 2.

The first electrode 110 is divided for each sub-pixel, and other layers of the white light emitting device OLED are integrally provided in an entire display area without any separation.

Here, reference numeral 119 represents a bank, and the bank 119 has an opening area with a hole shape. Light emission is performed in the opening area of the bank 119. The opening area of the bank 119 defines an emission portion of each subpixel.

Here, it can be called to a thin film transistor array substrate 1000 comprising the substrate 100, the transistor TFT and the color filters 109R, 109G and 109B.

The display device shown in FIG. 4 is a bottom emission-type display device. However, the present disclosure is not limited to a bottom emission-type display device. The display device of the present disclosure may be implemented as a top emission-type display device by changing the structure shown in FIG. 4 such that the color filter layers are located on the second electrode 120, such that reflective metal is included in the first electrode 110, and such that the second electrode 120 is formed as a transparent electrode or is formed of semi-transmissive metal.

Alternatively, the color filter layers may be omitted, and both the first electrode 110 and the second electrode 120 may be formed as transparent electrodes, thereby implementing a transparent organic light emitting device.

Hereinafter, in order to explain significance of arrangement of the light emitting layers of the present disclosure, the first experimental example Ex1 having a different structure from the present disclosure and the second experimental example Ex2 having the same structure with the present disclosure are explained.

Figure 5:
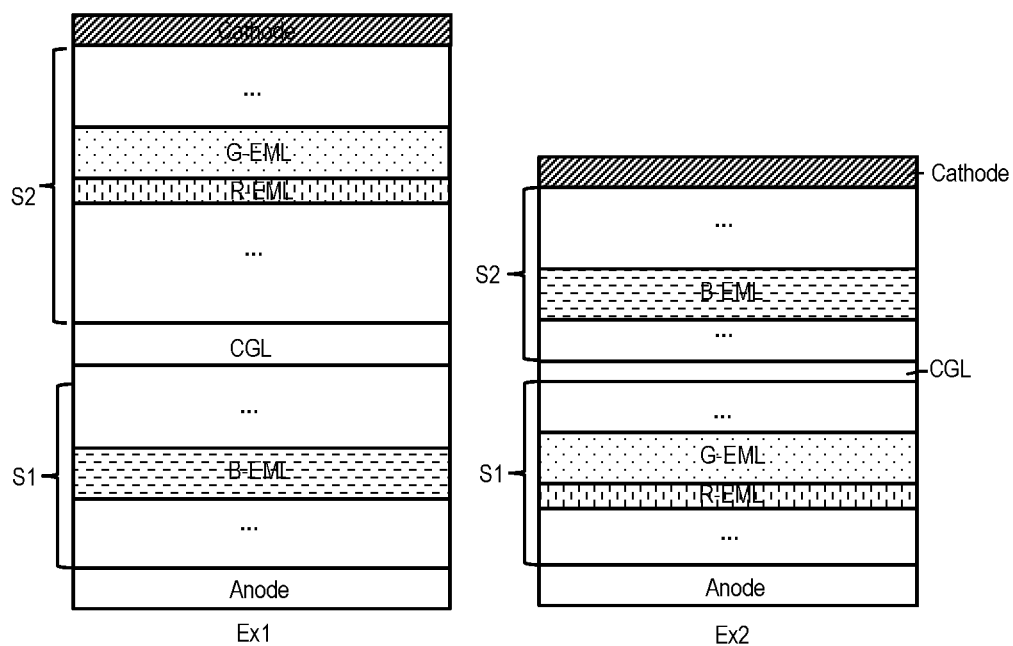
FIG. 5 is a cross-sectional view illustrating a first experimental example and a second experimental example.
Figure 6:
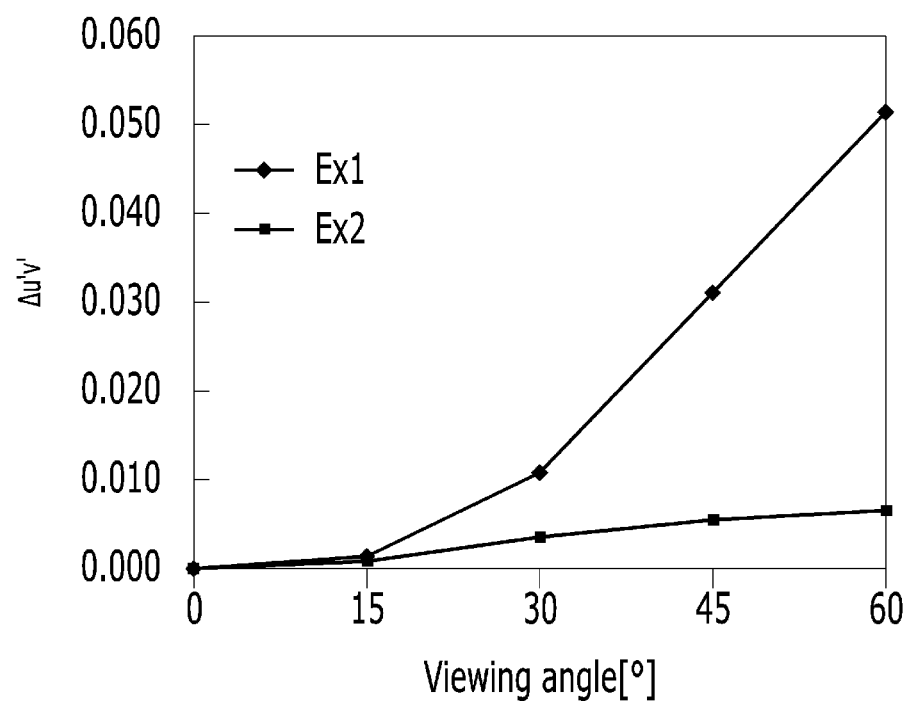
FIG. 6 is a graph illustrating color deviations according to viewing angles of the first and second experimental examples.

FIG. 5 is a cross-sectional view illustrating a first experimental example and a second experimental example, and FIG. 6 is a graph illustrating color deviations according to viewing angles of the first and second experimental examples.

As shown in FIG. 5, the first experimental example Ex1 comprises a first electrode Anode and a second electrode Cathode, and a white organic stack. The white organic stack includes a first stack S1 having a blue light emitting layer B-EML, a second stack S2 having red and green light emitting layers R-EML and G-EML contacting each other, and a charge generation layer CGL.

The second experimental example Ex2 comprises a first electrode Anode and a second electrode Cathode, and a white organic stack. The white organic stack includes a first stack S1 having red and green light emitting layers R-EML and G-EML contacting each other, a second stack S2 having a blue light emitting layer B-EML, and a charge generation layer CGL. The second experimental example Ex2 is a corresponded structure to FIG. 1 to FIG. 3.

The first and second experimental examples Ex1 and Ex2 may further comprise a common layer between the light emitting layer and the electrode(s).

Each color deviation Δu'v' of the first and second experimental examples Ex1 and Ex2 is evaluated by observing each EL spectrum of the first and second experimental examples Ex1 and Ex2 while changing the viewing angle by 15° from 0° to 60°.

As shown in FIG. 6, the first experimental example Ex1 has a large color deviation Δu'v' at the viewing angle 15° or more. In particular, the first experimental example Ex1 represents the color deviation of 0.051 at the viewing 50°. On the contrary, the second experimental example Ex2 applying the present disclosure has a color deviation Δu'v' under 0.010 from the viewing angle 0° to the viewing angle 60°. For example, in the white light emitting device of the second experimental example Ex2 of the present disclosure, it can be seen that each of the light emitting layers in the 2 stack structure is applied to a position that can maintain constant color and luminance regardless of a change of the viewing angle. The color deviation of FIG. 6 is represented as change amount Δu'v' value of color coordinate value at a certain viewing angle comparing with the value of color coordinate value at the front standard in the white color.

It can be seen that there is almost no color change in the second experimental example Ex2 compared to the first experimental example Ex1.

This color deviation value is a characteristic expressed as an important specification when applied to a product, and is an important item in a display device. It is also one of the important advantages of a display device including an organic light emitting device compared to a display device such an LCD and an LED.

Hereinafter, referring Table 1, efficiencies according to each color, color deviations at the viewing angle 50° and color reproduction effects of the first and second experimental examples Ex1 and Ex2 are explained.

TABLE 1

| Characteristics | | Ex1 | Ex2 |
|---|---|---|---|
| Efficiency(Cd/A)/at full white | R | 100% | 87% |
| | G | 100% | 97% |
| | B | 100% | 81% |
| | W | 100% | 95% |
| Color deviation at the viewing angle 50° (Δu'v') | | 0.051 | <0.01 |
| DCI Overlapping Ratio (%) | | 100% | 100% |
| BT2020 Overlapping Ratio (%) | | 100% | 103% |

In Table 1, the color efficiencies, the DCI Overlapping Ratio and the BT2020 Overlapping Ratio of the first experimental example Ex1 are represented as 100%, and the color efficiencies, the DCI Overlapping Ratio and the BT2020 Overlapping Ratio of the second experimental example Ex2 are evaluated by comparing each values of the first experimental example Ex1. Table 1 shows each color efficiency of R, G, B and W at each of R G, B, and W sub-pixels to express a full white in the first and second experimental examples Ex1 and Ex2. To express the full white, in the second experimental example Ex2, the efficiencies of green and white are higher than the efficiencies of red and blue. Also, the Table 1 shows that in order to express same full white, the second experimental example Ex2 requires smaller efficiencies of R, G, B and W colors than those of the first experimental example Ex1.

As shown in FIGS. 5 and 6, the color deviation represented by the second experimental example Ex2 is less than 1/10 of that of the first experimental example Ex1, so that there is almost no color deviation according to the viewing angle change.

DCI stands for Digital Cinema Initiatives that can be expressed in a digital cinema. BT2020 is a standard of 4K UHD recommended by ITU International broadcasting standard organization, and is also called Rec.2020. More stringent standards are applied in BT2020 than in DCI, and the color expression area of BT2020 is larger than that of DCI.

The Table 1 shows that the second experimental example Ex2 has a color reproduction equal to or higher than that of the first experimental example Ex1. This means that the second experimental example Ex2 realizes a more accurate and clear image than the first experimental example Ex1.

The white light emitting device is considered in view of a display device. The display device may comprise white, red, green and blue subpixels each emitting white, red, green and blue lights. An aperture ratio and driving power defined by an opening area of the bank 119 of FIG. 4 may be determined in consideration of the efficiencies, lifetimes and color coordinates of each sub-pixel. In addition, relative color difference in subpixels can be compensated by controlling the aperture ratio and the driving power.

Hereinafter, as structures implementing three peaks, the above-described first and second experimental examples Ex1 and Ex2 each having two stacks, and an experimental example Ex3 having three stacks are further explained.

Figure 7A:
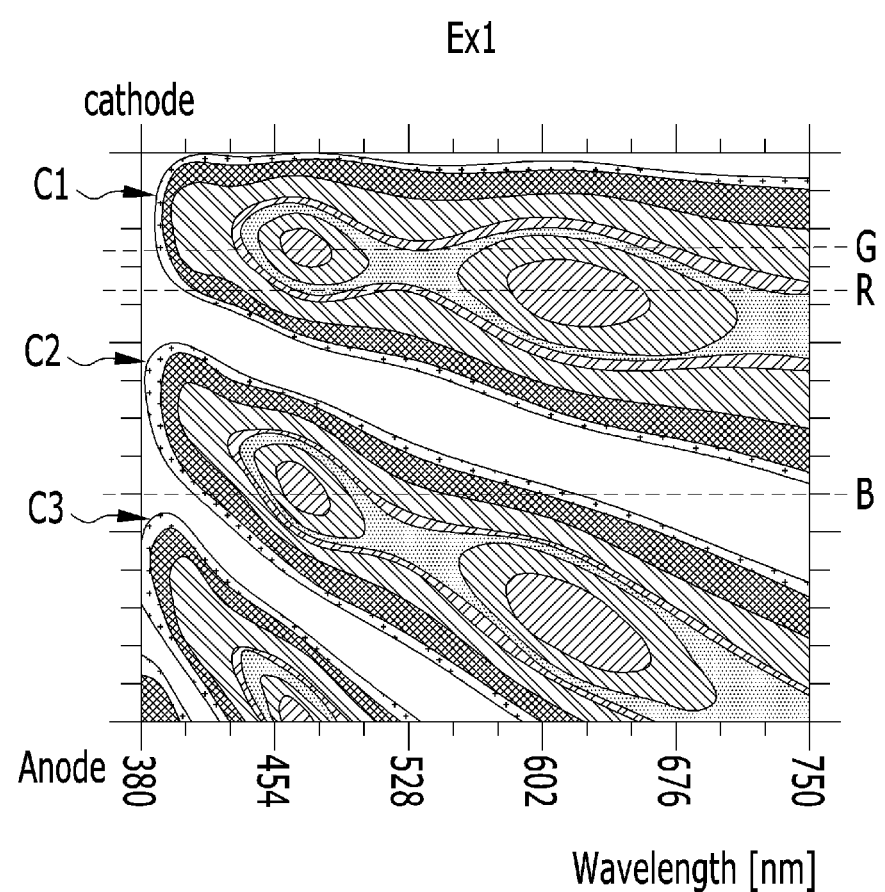
FIG. 7A to FIG. 7C are contour maps illustrating the first to third experimental examples.
Figure 7B:
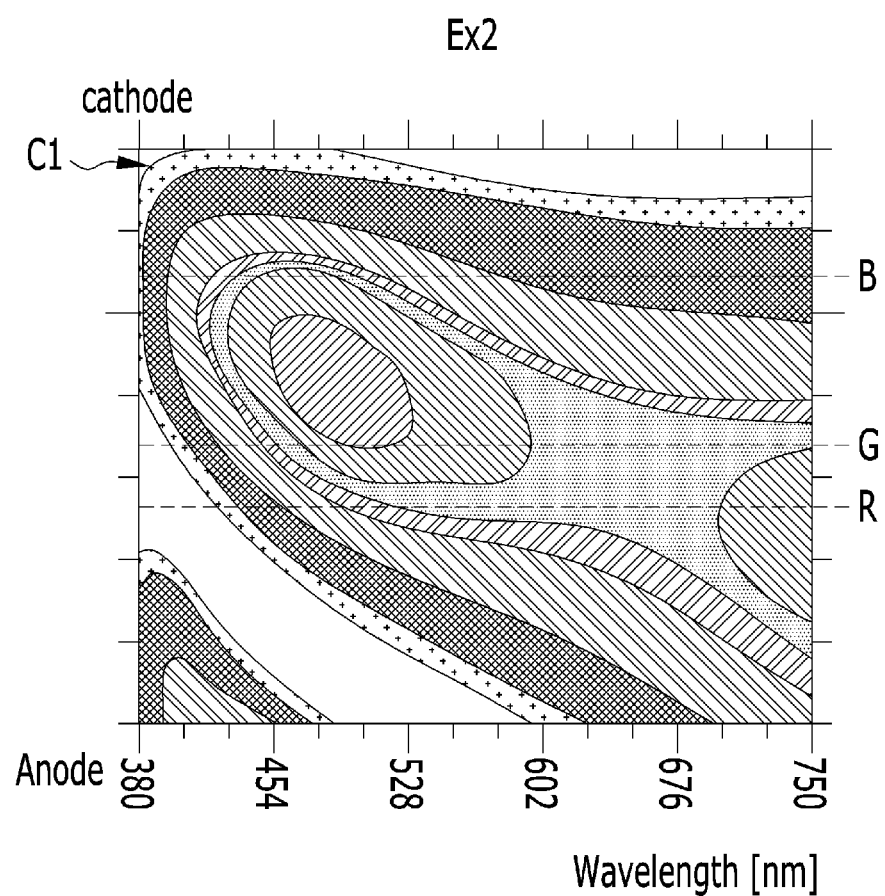
Figure 7C:
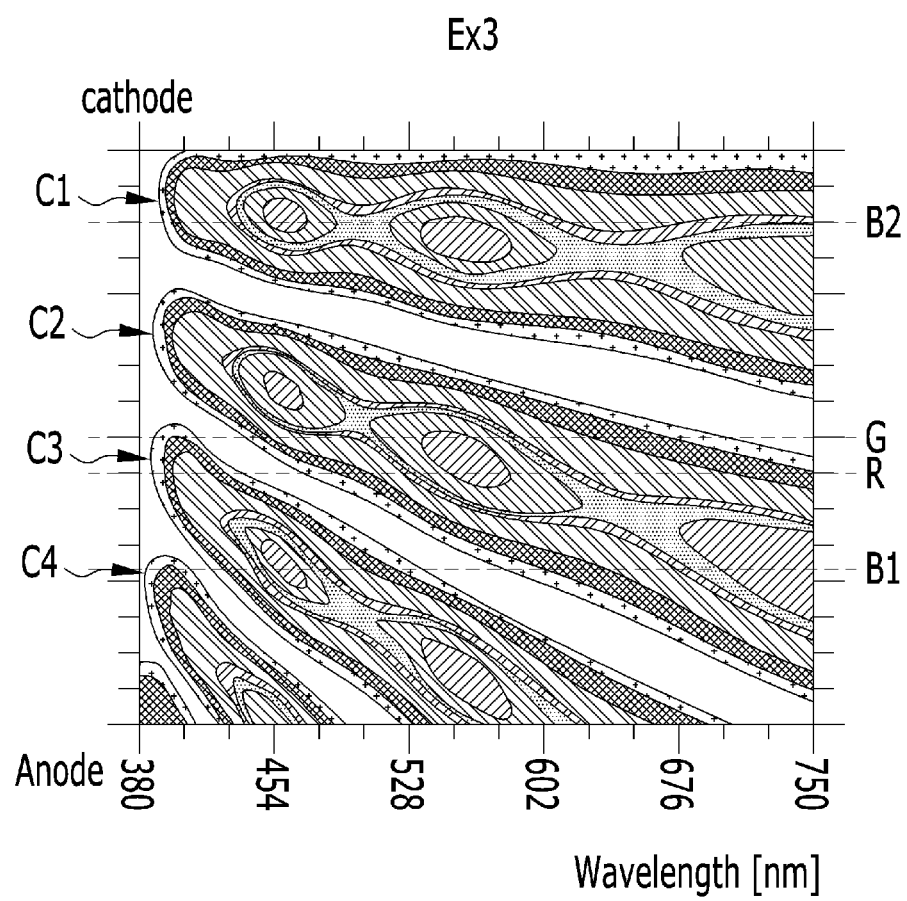

FIG. 7A to FIG. 7C are contour maps illustrating the first to third experimental examples.

As shown in FIG. 7A, in the first experimental example Ex1 having two stacks, the blue light emitting layer B-EML is disposed in the first stack and red and green light emitting layers R-EML and G-EML are disposed in the second stack. A total vertical distance from a lower surface of the first electrode Anode to a lower surface of the second electrode Cathode is 4300 Å to 4500 Å. The first experimental example Ex1 requires a thicker vertical distance from the lower surface of the first electrode to the lower surface of the second electrode. Since a thickness of the first electrode is thicker at 1000 Å or more, and emission region of the blue light emitting layer B-EML and emission regions of the red and green light emitting layers R-EML and G-EML are disposed at different first and second contour regions C1 and C2, the contour regions C1 and C2 each having maximum intensity of each stack, an optical distance is substantially formed over a wide distance in the first experimental example Ex1. Since the third contour region C3 does not represent an enough vertical distance to dispose a light emitting layer for any emission color, the blue light emitting layer B-EML of the first stack as a first light emitting is far from the first electrode in the first experimental example Ex1. This means that a thickness of a common layer between the first electrode Anode and the blue light emitting layer B-EML is very thick, and as a result, an overall thickness of the white organic stack is increased. Also, in the first experimental example Ex1, since an inclination of the second contour region C2 in which the blue light emitting layer B-EML is positioned is different from an inclination of the first contour region C1 in which the red and green light emitting layers R-EML and G-EML are positioned, the color deviation of blue and the red and green color deviations are different when the viewing angle is changed. It causes luminance difference and color deviation according to the change of the viewing angle.

In the second experimental example Ex2 according to FIGS. 1-3, as shown in FIG. 7B, red and green light emitting layers R-EML and G-EML are disposed in the first stack and the blue light emitting layer B-EML is disposed in the second stack. A total vertical distance d from a lower surface of the first electrode Anode to a lower surface of the second electrode Cathode is 1500 Å to 2000 Å (=150 nm~200 nm). Even though the second experimental example Ex2 has two stacks, the total vertical distance d of the second experimental example Ex2 is smaller than a half of that of the first experimental example Ex1 since the blue light emitting layer B-EML, the green light emitting layer G-EML and the red light emitting layer R-EML are disposed in the contour region C1 having single inclination.

Also, the thickness of the first electrode in the second experimental example Ex2 is smaller than a half of thickness of the first electrode in the first experimental example Ex1.

For example, the second experimental example Ex2 may provide a white organic stack WEL having a thickness of 1500 Å or less and the first electrode in which a thickness of the first electrode is 0.1 times or more and 0.26 times or less of a distance from a lower surface of the first electrode to a lower surface of the second electrode. In this case, the thickness of the first anode in the second experimental example Ex2 may be a half or less than that of the first experimental example Ex1 in which the thickness of the first electrode is 1000 Å or more. In addition, a ratio of the thickness of the first electrode 110 having an optical effect with respect to the distance d from the lower surface of the first electrode 110 to the lower surface of the second electrode 120 is smaller than that of the first experimental example Ex1, thus a transmittance of light passing through the first electrode 110 from the white organic stack WEL may be increased. In the second experimental example Ex2, blue, green and red light emitting layers B-EML, G-EML and R-EML are disposed at the contour region C1 having the single inclination, and the single inclination is gentle at the contour region C1, in a vertical distanced from the lower surface of the first electrode 110 to the lower surface of the second electrode 120, the blue, green and red light emission regions B-EMZ, G-EMZ and R-EMZ of the blue, green and red light emitting layers (as shown in FIG. 1) can be secured in a certain vertical distance. Therefore, even when the view watches the display device while tilting at a certain viewing angle, the same color can be felt without any color change or luminance change from watching the front of the display device.

As shown in FIG. 7C, the third experimental example Ex3 has three stacks and realizes three peaks. In the third experimental example Ex3, a first blue light emitting layer B1-EML is disposed in the first stack, red and green light emitting layers R-EML and G-EML are disposed in the second stack, and a second blue light emitting layer B2-EML is disposed in the third stack. The third experimental example Ex3 is intended to increase blue efficiency. A total vertical distance from a lower surface of the first electrode Anode to a lower surface of the second electrode Cathode is 5300 Å to 5500 Å. The third experimental example Ex3 requires additional stacks over the first and second experimental examples Ex1 and Ex2, and the thickness of the first electrode Anode is thicker, similar to the thickness of the first electrode in the first experimental example Ex1. In the third experimental example Ex3, the first to fourth contour regions C1, C2, C3 and C4 have different inclinations each other. To the first to fourth contour regions, the first blue light emitting layer B1-EML is disposed in the third contour region C3, the red and green light emitting layers R-EML and G-EML are disposed in the second contour region C2 and the second blue light emitting layer B2-EML is disposed in the first contour region C1. The third experimental example Ex3 requires increased thickness corresponding to the vertical distance from the lower surface of the first electrode to the lower surface of the second electrode and increased thickness of a common layer between the first electrode and the first blue light emitting layer for the same reason as the first experimental example Ex1, also lowers process capability and increases driving voltages as the number of stacks increases. Furthermore, since the light emitting layers B1-EML, R-EML, G-EML and B2-EML provided in the first to third stacks are positioned in the contour regions C3, C2 and C1 having different inclination, a deviation according to change of a viewing angle in a blue color is different from a deviation according to change of viewing angle in a red and green colors. Such different tendency according to the viewing angle in colors causes a large color deviation as the viewing angle becomes large.

For example, comparing vertical distances from the lower surface of the first electrode to the lower surface of the second electrode in the first to third experimental examples Ex1 to Ex3, the vertical distance of the first experimental example Ex1 is over twice or more than that of the second experimental example Ex2 and the vertical distance of the first experimental example Ex3 is over 2.5 times or more than that of the second experimental example Ex2. Thus, the first and third experimental examples Ex1 and Ex3 may have problems in that burden of process is high and driving voltage is increased.

Also, since the first and third experimental examples Ex1 and Ex3 uses emitting layers provided in different contour regions having different inclination for a plurality stacks, the first and third experiment examples Ex1 and Ex3 has different tendencies according to a viewing angle for the plurality of stack, and has problems of color deviation and luminance change in change of the viewing angle. On the contrary, in the second experimental example Ex2, the light emitting layers are provided in the contour region have the single inclination, thus the second experimental example Ex2 can overcome color deviation and luminance change in change of the viewing angle.

Hereinafter, effects of the present disclosure are will be explained.

Figure 8:
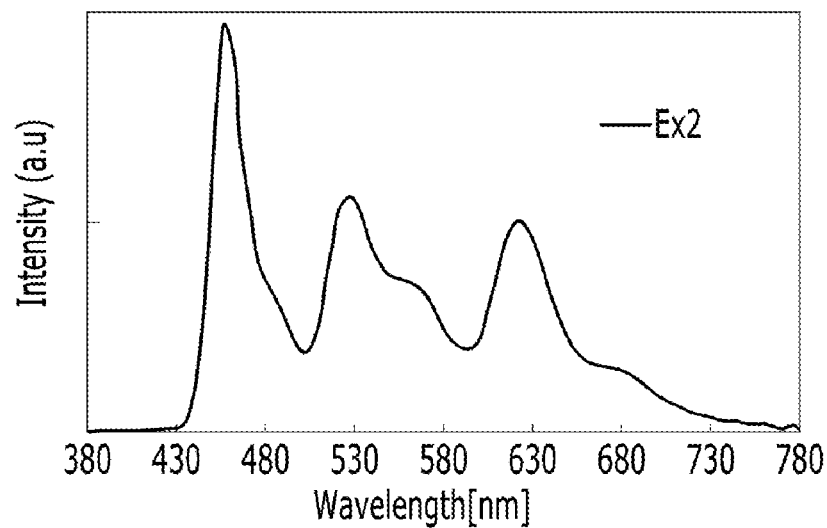
FIG. 8 is a graph illustrating light intensity according to wavelength of the white light emitting device of the present disclosure.
Figure 9:
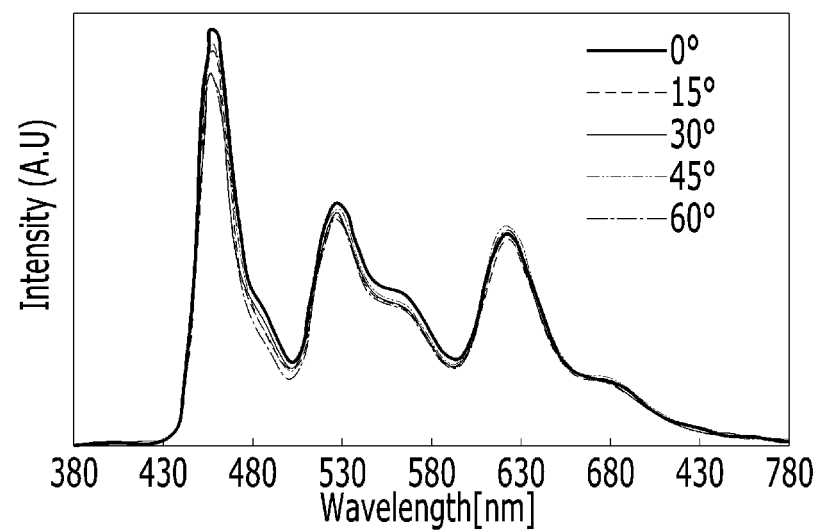
FIG. 9 is a graph illustrating light intensity according to wavelength for each viewing angle of the white light emitting device of the present disclosure.
Figure 10:
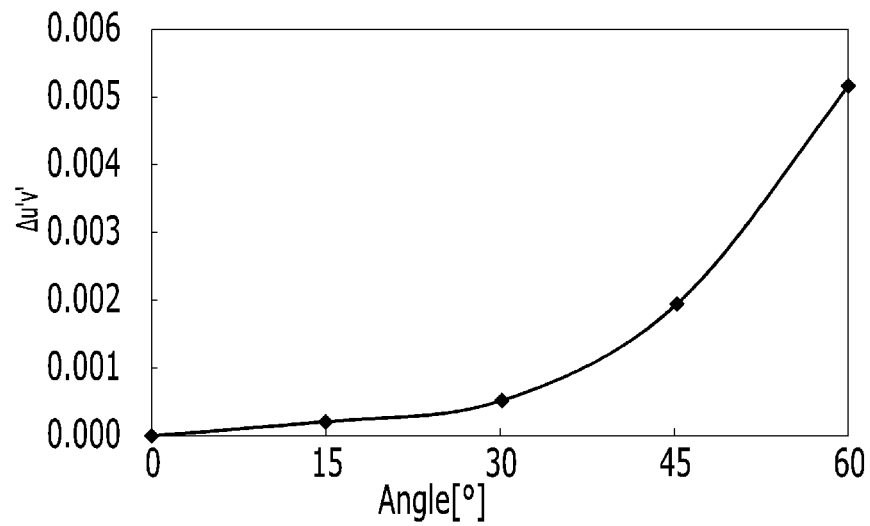
FIG. 10 is a graph illustrating color deviations according to viewing angles of the present disclosure.
Figure 11:
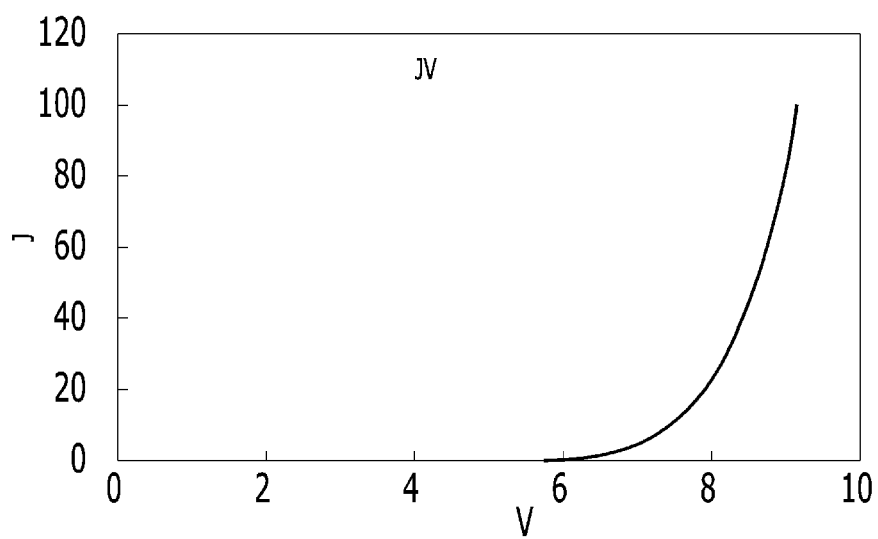
FIG. 11 is a graph illustrating J-V curve in the white light emitting device of the present disclosure.

FIG. 8 is a graph illustrating light intensity according to wavelength of the white light emitting device of the present disclosure. FIG. 9 is a graph illustrating light intensity according to wavelength for each viewing angle of the white light emitting device of the present disclosure. FIG. 10 is a graph illustrating color deviations according to viewing angles of the present disclosure. FIG. 11 is a graph illustrating J-V curve in the white light emitting device of the present disclosure.

As shown in FIG. 8, the white light emitting device of the present disclosure can realize 3 peaks representing emitting peak characteristics for blue, green and red.

Also, as shown in FIG. 9, referring the EL spectrum of the white light emitting device of the present disclosure while change the viewing angle by 15° from 0° to 60° from the front, it can be seen that there is almost no change in the intensity for each emission color. For example, the white light emitting device according to the present disclosure represents the same color and the same luminance characteristics even when the viewing angle is changed.

FIG. 10 shows the color deviation value Δu'v' according to the change of the viewing angle from the front to 60° while change the viewing angle from 0° to 15°. In FIG. 10, the vertical axis is enlarged to make it easier to understand. Substantially, in the present disclosure, the color deviation value Δu'v' at the viewing angle 60° is less than or equal to 0.005, which is 0.1 times or less than that of the first experimental example Ex1 described above. It can be seen the color deviation according to the change of the viewing angle is insignificant in the present disclosure.

As shown in FIG. 11, the white light emitting device of the present disclosure exhibits a current density of 10 mA/cm2 or more at a driving voltage of 7 V or more, it indicates that the white light emitting device of the present disclosure realize a stable device with a current density of a certain level or more at a predetermined driving voltage.

In the present disclosure, a thickness of charge generation layer is very thin between the first stack S1 and the second stack S2 since a thickness of the white light emitting device is thin. The total thickness of the charge generation layer (160 in FIG. 2) is from 60 Å to 150 Å. The charge generation layer 160 may comprise the n-type charge generation layer and the p-type charge generation layer.

If the thickness of the charge generation layer 160 is less than 60 Å, the white light emitting device may not have enough lifespan. If the thickness of the charge generation layer 160 is more than 150 Å, it is difficult to have a different common layer between the light emission region of the green light emitting layer G-EMZ and the light emission region of the blue light emitting layer B-EMZ. So the thickness of the charge generation layer 160 is greater than or equal to 60 Å and less than or equal to 150 Å.

Hereinafter, referring the first and second experimental examples Ex1 and Ex2 and a fourth experimental example Ex4, characteristics of a driving voltage according to a thickness of the charge generation layer is explained. The fourth experimental example Ex4 has the same structure as the second experimental example Ex2, and the red and green light emitting layers are disposed in the first stack and the blue light emitting layer is disposed in the second stack.

TABLE 2

|  | Ex1 | Ex2 | Ex4 |
| --- | --- | --- | --- |
| p-type charge generation layer(Å) | 75 | 65 | 30 |
| n-type charge generation layer(Å) | 150 | 65 | 30 |
| Driving voltage[V](at 10 J) | 8.5 | 7.4 | 7.8 |
| Driving voltage[V](at 100 J) | 11.0 | 9.2 | 9.8 |

TABLE 2-continued

|  | Ex1 | Ex2 | Ex4 |
| --- | --- | --- | --- |
| Efficiency (Cd/A) | 58.9 | 51.1 | 54.9 |
| Color coordinate (CIEx, CIEy) | (0.32, 0.29) | (0.31, 0.33) | (0.38, 0.43) |
| Luminance half-width | 0.89 | 0.92 | 0.85 |
| Color deviation (Δu'v') at 60° viewing angle | 0.048 | 0.006 | 0.006 |

As described above, the second experimental example Ex2 has thin first electrode and the thin total thickness of the white organic stack. Thus, the second experimental example Ex2 can increase productivity and lower the driving voltage than the first experimental example Ex1. Also, in the second experimental example Ex2, there is almost no color deviation according to the change of the viewing angle. In the above experiments based on the Table 2, the total thickness of the charge generation layer comprising the n-type charge generation layer and the p-type charge generation layer is 130 Å in the second experimental example Ex2.

In the fourth experimental example Ex4, the total thickness of the charge generation layer comprising the n-type charge generation layer and the p-type charge generation layer is 60 Å. It can be seen that the driving voltage is increased and characteristics of color coordinate are changed in the fourth experimental example Ex4 than those of the second experimental example Ex2. For example, the red and green light emitting layers of the first stack and the blue light emitting layer of the second stack are disposed in the contour region having the single inclination, so the distance from the green light emitting layer to the blue light emitting layer is very short in the white light emitting device according to the present disclosure. Therefore, as a common layer, the charge generation layer positioned between the green light emitting layer and the blue light emitting layer has a thickness less than or equal to 130 Å and more than or equal to 60 Å, it is possible to lower the driving voltage and reduce or prevent color deviation or luminance change.

Figure 12:
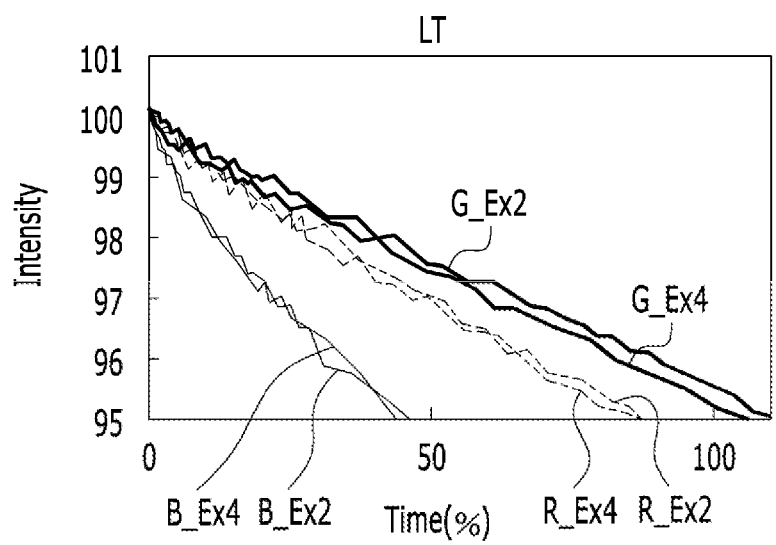
FIG. 12 is a graph illustrating lifetimes of the second and fourth experimental examples of white light emitting devices.
Figure 13:
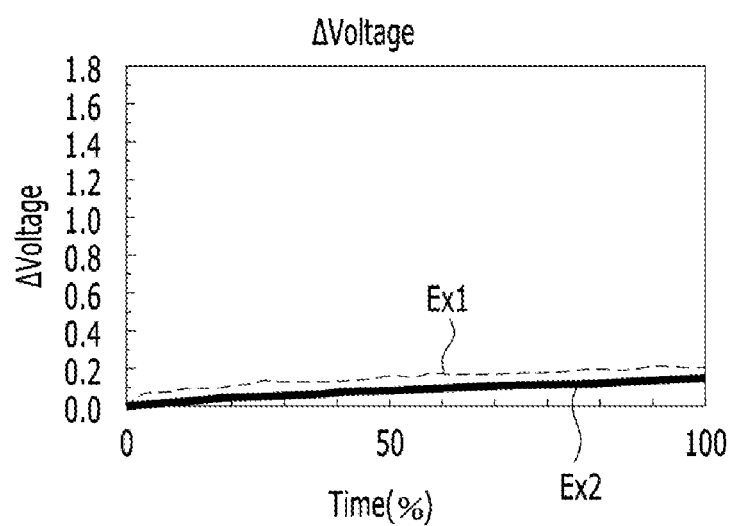
FIG. 13 is a graph illustrating deviations of driving voltage according to time in the first and second experimental examples.
Figure 14:
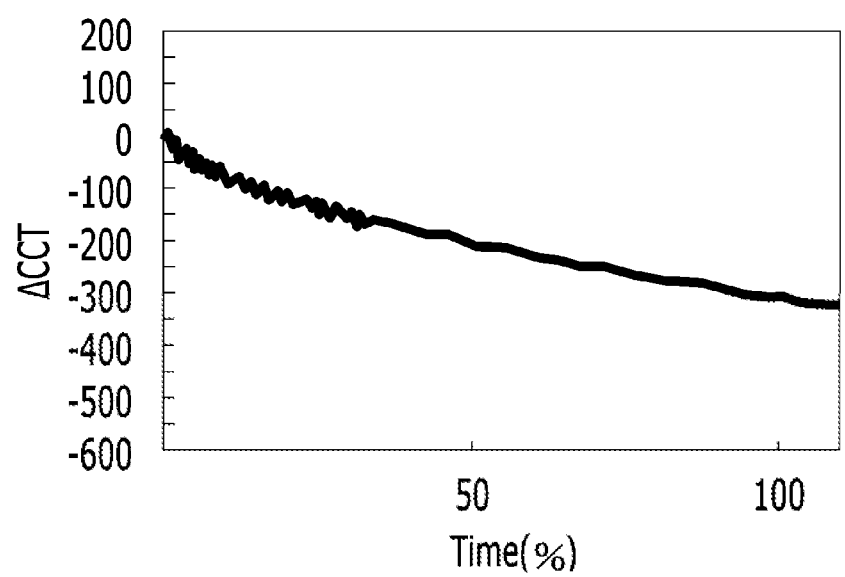
FIG. 14 is a graph illustrating deviation of color temperature according to time in the white light emitting device of the present disclosure.

FIG. 12 is a graph illustrating 95 lifetimes of the second and fourth experimental examples of white light emitting devices. FIG. 13 is a graph illustrating deviations of driving voltage according to time in the first and second experimental examples. FIG. 14 is a graph illustrating deviation of color temperature according to time in the white light emitting device of the present disclosure. Hereinafter, a white light emitting device and a display device of the present disclosure is explained referring drawings.

Referring a result of evaluating 95 lifetimes showing the luminance level of 95% with respect to the initial luminance shown in FIG. 12, the second experimental example Ex2 and the fourth experimental example Ex4 represent similar tendencies in their lifetimes. In general, the second experimental example Ex2 is superior to the fourth experimental example Ex4, which means that the thickness of the charge generation layer needs to be secured to a certain level or more.

The time 100% presented in the experimental examples of FIGS. 12 to 14 may be several hundred hours as a reference time for examining the lifetime of the device under an acceleration condition.

As a result of evaluating the driving voltage change ΔV with regard to time for the first experimental example Ex1 (referring to FIG. 7A) and the second experimental example Ex2 (referring FIG. 7B), it can be seen that the driving voltage change of the second experimental example Ex2 is smaller than that of the first experimental example Ex1. For example, in the structure of the second experimental example Ex2 of the present disclosure, there is almost no driving voltage variation as time goes on, thus it represents driving stability in the present disclosure.

FIG. 14 shows change of color temperature ACCT in the present disclosure according to time. In FIG. 14, time 100% means a time to evaluate a normal level of color temperature, which corresponds to several hundred hours. It shows that the change of the color temperature is less than 300 K even after several hundred hours, so it can be seen that the color temperature characteristics of the initial level are exhibited even after a certain period of time has elapsed.

For example, through the above experiment, it is said that there is little variation in the driving voltage, increased lifespan is secured and the color temperature characteristics can be stably secured.

When applying a white organic stack in a display device, the color temperature needs to be adjusted to a certain level. For considering this, an additional stack is required and a driving voltage is increased due to an increased thickness of the white organic stack. Also it may cause to lower a panel application performance due to the increased driving voltage. The white light emitting device and the display device according to the present disclosure can solve such problems. For example, the white light emitting device and the display device according to the present disclosure can adjust the color temperature at the certain level, comprehensively matches the color viewing angle characteristics, luminance decrease rate, and color reproduction rate, thus stabilizes the color viewing angle characteristics generated in the multi-stack structure, remains the color temperature and main wavelength characteristics, and additionally prevent decrease in luminance according to the viewing angle.

The white light emitting device of the present disclosure is a device having three peaks of red, green and blue colors. For example, it can be seen that in the white light emitting device of the present disclosure, there is little change in intensity and no decrease in luminance for each of red, green and blue light. In other words, it shows an equal level in all directions, and in view of this trend, it seems that the white light emitting device and the display device using the same according to the present disclosure can be applied to a new generation model.

In addition, the white light emitting device of the present disclosure can be enlarge. The viewing angle range required for a large-area display device is wide. In the white light emitting device and the display device of the present disclosure, the same luminance and color efficiency are exhibited at the above-described wide viewing angle range, and thus good characteristics suitable for viewing by many watchers in a wide space are exhibited. Also, since the structure is also simple, its application range is expected to be diversified. There is almost no change in intensity for each peak, so it is possible to display the same image in any direction.

Further, the white light emitting device of the present disclosure optimizes the optical distance and positions of light emitting regions of the light emitting layers by adjusting a vertical distance between light emitting layers provided in the different stacks related to the contour region having the single inclination, so the display device having the white light emitting device of the present disclosure has little color deviation and luminance change irrespective of change of a viewing angle.

The two-stack structure according to the present disclosure reconstructs the stacking order and an optical distance to limit a thickness range of the first electrode, an entire thickness of the organic material in the white organic stack and positions of the light emitting layers, so there is almost no color deviation depending on the viewing angle, and the same luminance and color characteristics in all directions without a decrease in luminance. Through this, it is possible to expand application to a product for an IT and a display device.

For example, a white organic light emitting device according to one aspect of the present disclosure may comprise a first stack on a first electrode, the first stack including a red light emitting layer and a green light emitting layer, a charge generation layer on the first stack, a second stack on the charge generation layer, the second stack including a blue light emitting layer and a second electrode on the second stack, wherein a light is emitted through the first electrode, and wherein a thickness of the first electrode is 0.1 times or more and 0.26 times or less of a distance from a lower surface of the first electrode to a lower surface of the second electrode.

The distance from the lower surface of the first electrode to the lower surface of the second electrode may be 150 nm to 200 nm.

The blue light emitting layer may have an electroluminescence peak at a wavelength of 454 nm to 458 nm, the green light emitting layer may have an electroluminescence peak at a wavelength of 525 nm to 540 nm, and the red light emitting layer may have an electroluminescence peak at a wavelength of 560 nm to 626 nm.

Each of the blue light emitting layer and the green light emitting layer may be thicker than the red light emitting layer.

The charge generation layer may be thinner than the red light emitting layer.

The white light emitting device may further comprise a first common layer between the first electrode and the red light emitting layer, a second common layer between the green light emitting layer and the charge generation layer, a third common layer between the charge generation layer and a blue light emitting layer and a fourth common layer between the blue light emitting layer and the second electrode. The red light emitting layer may be in contact with the green light emitting layer.

A distance from an upper surface of the green light emitting layer to a lower surface of the blue light emitting layer may be 30 nm to 65 nm.

A display device according to one aspect of the present disclosure may comprise a substrate including a plurality of sub-pixels, a thin-film transistor at each of the sub-pixels, a first electrode connected to the thin-film transistor, at each of the sub-pixels, a white organic stack on the first electrode, the white organic stack comprising a first stack including a red light emitting layer and a green light emitting layer, a second stack including a blue light emitting layer and a charge generation layer between the first and second stacks, and a second electrode on the white organic stack. A light may be emitted through the first electrode from the white organic stack. A thickness of the first electrode may be 0.1 times or more and 0.26 times or less of a total thickness of the first electrode and the white organic stack.

The display device according to one aspect of the present disclosure may further comprise a color filter between the substrate and first electrode.

In the display device of the present disclosure, the first electrode may be a transparent electrode and the second electrode may be a reflective electrode.

In the display device of the present disclosure, the distance from the lower surface of the first electrode to the lower surface of the second electrode may be 150 nm to 200 nm.

In the display device of the present disclosure, the blue light emitting layer may have an electroluminescence peak at a wavelength of 454 nm to 458 nm, the green light emitting layer may have an electroluminescence peak at a wavelength of 525 nm to 540 nm, and the red light emitting layer may have an electroluminescence peak at a wavelength of 560 nm to 626 nm.

In the display device of the present disclosure, each of the blue light emitting layer and the green light emitting layer may be thicker than the red light emitting layer.

In the display device of the present disclosure, the charge generation layer may be thinner than the red light emitting layer.

The display device of the present disclosure, further comprises a first common layer between the first electrode and the red light emitting layer, a second common layer between the green light emitting layer and the charge generation layer, a third common layer between the charge generation layer and a blue light emitting layer and a fourth common layer between the blue light emitting layer and the second electrode. The red light emitting layer may be in contact with the green light emitting layer.

In the display device of the present disclosure, a distance from an upper surface of the green light emitting layer to a lower surface of the blue light emitting layer may be 30 nm to 65 nm.

In the display device of the present disclosure, a distance from a lower surface of the red light emitting layer to an upper surface of the blue light emitting layer may be 80 nm to 115 nm.

The white light emitting device of the present disclosure specifies positions of the red, green and blue light emitting layers, and adjusts a thickness of a first electrode in a constant relation to a total thickness including the first electrode and the white organic stack so that spectrum of each light can be maintained the same or similar to that of the front even when the viewing is changed, while disposing emission region of each light emitting layer in the contour region having the same gentle inclination. Since there is no color variation according to a change in the viewing angle, it is advantageous to apply the white light emitting device of the present disclosure in the display device. Especially, since it hardly causes a change in viewing angle in all directions, when applied to a large area, excellent color characteristics can be exhibited without causing a color difference even when many viewers watch.

Also, the white light emitting device and the display device of the present disclosure does not cause luminance deviation according to the change of the viewing angle, it is possible to realize the same image in a wide viewing angle.

Furthermore, the white light emitting device and the display device of the present disclosure can realize 3 peaks with a minimum structure in a white organic stack, thus it is possible to reduce a driving voltage and improve capability of process at the same time.

It will be apparent to those skilled in the art that various modifications and variations can be made in the present disclosure without departing from the spirit or scope of the disclosure. Thus, it is intended that the present disclosure cover the modifications and variations of this disclosure provided they come within the scope of the appended claims and their equivalents.

What is claimed is:

1. A white light emitting device comprising:
    a first stack disposed on a first electrode through which light is emitted and including a red light emitting layer and a green light emitting layer;
    a charge generation layer disposed on the first stack;
    a second stack disposed on the charge generation layer and including a blue light emitting layer; and
    a second electrode disposed on the second stack,
    wherein a thickness of the first electrode is 0.1 times or more and 0.26 times or less of a distance from a lower surface of the first electrode to a lower surface of the second electrode, and
    wherein the distance from the lower surface of the first electrode to the lower surface of the second electrode is 150 nm to 200 nm.

2. The white light emitting device according to claim 1, wherein the blue light emitting layer, the green light emitting layer and the red light emitting layer are located in a single contour region of a contour map.

3. The white light emitting device according to claim 1, wherein the blue light emitting layer has an electroluminescence peak at a wavelength of 454 nm to 458 nm,
    the green light emitting layer has an electroluminescence peak at a wavelength of 525 nm to 540 nm, and
    the red light emitting layer has an electroluminescence peak at a wavelength of 560 nm to 626 nm.

4. The white light emitting device according to claim 1, wherein each of the blue light emitting layer and the green light emitting layer is thicker than the red light emitting layer.

5. The white light emitting device according to claim 4, wherein the charge generation layer is thinner than the red light emitting layer.

6. The white light emitting device according to claim 1, further comprising:
    a first common layer disposed between the first electrode and the red light emitting layer;
    a second common layer disposed between the green light emitting layer and the charge generation layer;
    a third common layer disposed between the charge generation layer and the blue light emitting layer; and
    a fourth common layer disposed between the blue light emitting layer and the second electrode,
    wherein the red light emitting layer is in contact with the green light emitting layer.

7. The white light emitting device according to claim 1, wherein a distance from an upper surface of the green light emitting layer to a lower surface of the blue light emitting layer is 30 nm to 65 nm.

8. The white light emitting device according to claim 1, wherein the charge generation layer includes a n-type charge generation layer and a p-type charge generation layer, and the thickness of the charge generation layer is 6 nm to 13 nm.

9. A display device comprising:
    a substrate including a plurality of sub-pixels;
    a thin-film transistor disposed at each of the sub-pixels;
    a first electrode connected to the thin-film transistor at each sub-pixel;
    a white organic stack disposed on the first electrode through which light is emitted from the white organic stack and comprising a first stack including a red light emitting layer and a green light emitting layer, a second stack including a blue light emitting layer and a charge generation layer disposed between the first stack and the second stack; and
    a second electrode disposed on the white organic stack,
    wherein a thickness of the first electrode is 0.1 times or more and 0.26 times or less of a total thickness of the first electrode and the white organic stack, and
    wherein the distance from the lower surface of the first electrode to the lower surface of the second electrode is 150 nm to 200 nm.

10. The display device according to claim 9, wherein the blue light emitting layer, the green light emitting layer and the red light emitting layer in the white organic stack are located in a single contour region of a contour map.

11. The display device according to claim 10, wherein a distance from an upper surface of the green light emitting layer to a lower surface of the blue light emitting layer is 30 nm to 65 nm.

12. The display device according to claim 11, wherein a distance from a lower surface of the red light emitting layer to an upper surface of the blue light emitting layer is 80 nm to 115 nm.

13. The display device according to claim 9, further comprising a color filter disposed between the substrate and the first electrode.

14. The display device according to claim 9, wherein the first electrode is a transparent electrode and the second electrode is a reflective electrode.

15. The display device according to claim 9, wherein the blue light emitting layer has an electroluminescence peak at a wavelength of 454 nm to 458 nm,
    the green light emitting layer has an electroluminescence peak at a wavelength of 525 nm to 540 nm, and
    the red light emitting layer has an electroluminescence peak at a wavelength of 560 nm to 626 nm.

16. The display device according to claim 9, wherein each of the blue light emitting layer and the green light emitting layer is thicker than the red light emitting layer.

17. The display device according to claim 16, wherein the charge generation layer is thinner than the red light emitting layer.

18. The display device according to claim 9, wherein the white organic stack further comprises:
    a first common layer disposed between the first electrode and the red light emitting layer;
    a second common layer disposed between the green light emitting layer and the charge generation layer;
    a third common layer disposed between the charge generation layer and a-the blue light emitting layer; and
    a fourth common layer disposed between the blue light emitting layer and the second electrode,
    wherein the red light emitting layer is in contact with the green light emitting layer.

* * * * *